US011677002B2

(12) United States Patent
Lin et al.

(10) Patent No.: US 11,677,002 B2
(45) Date of Patent: Jun. 13, 2023

(54) SEMICONDUCTOR STRUCTURE

(71) Applicant: Vanguard International Semiconductor Corporation, Hsinchu (TW)

(72) Inventors: Shin-Cheng Lin, Tainan (TW); Chih-Hung Lin, Taichung (TW); Po-Heng Lin, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 175 days.

(21) Appl. No.: 17/023,054

(22) Filed: Sep. 16, 2020

(65) Prior Publication Data

US 2022/0085163 A1    Mar. 17, 2022

(51) Int. Cl.
*H01L 29/778* (2006.01)
*H01L 29/20* (2006.01)
*H01L 29/06* (2006.01)
*H01L 29/205* (2006.01)

(52) U.S. Cl.
CPC ...... *H01L 29/0692* (2013.01); *H01L 29/2003* (2013.01); *H01L 29/205* (2013.01); *H01L 29/7786* (2013.01)

(58) Field of Classification Search
CPC ............... H01L 29/2003; H01L 29/205; H01L 29/7786; H01L 29/0684
See application file for complete search history.

(56) References Cited

U.S. PATENT DOCUMENTS

| 2011/0114967 | A1* | 5/2011 | Hikita | ................. | H01L 29/432 |
| | | | | | 257/E29.091 |
| 2020/0006522 | A1* | 1/2020 | Yeh | ..................... | H01L 29/2003 |
| 2020/0161447 | A1* | 5/2020 | Chou | ................. | H01L 21/0254 |

FOREIGN PATENT DOCUMENTS

| TW | 201904066 A | 1/2019 |
| TW | I692868 B | 5/2020 |

OTHER PUBLICATIONS

Taiwanese Office Action and Search Report for Taiwanese Application No. 109118913, dated Sep. 30, 2021.

* cited by examiner

*Primary Examiner* — Fernando L Toledo
*Assistant Examiner* — Valerie N Newton
(74) *Attorney, Agent, or Firm* — Birch, Stewart, Kolasch & Birch, LLP

(57) ABSTRACT

A semiconductor structure includes a substrate, a channel layer, a barrier layer, a source structure, a drain structure, a doped compound semiconductor layer, a dielectric layer, and a gate structure. The channel layer is disposed on the substrate. The barrier layer is disposed on the channel layer. The source structure and the drain structure are disposed on opposite sides of the barrier layer. The doped compound semiconductor layer is disposed on the barrier layer. The doped compound semiconductor layer has a first side adjacent to the source structure and a second side adjacent to the drain structure. The doped compound semiconductor layer has at least one opening exposing at least a portion of the barrier layer. The dielectric layer is disposed on the doped compound semiconductor layer and the barrier layer. The gate structure is disposed on the doped compound semiconductor layer.

12 Claims, 12 Drawing Sheets

SEMICONDUCTOR STRUCTURE

BACKGROUND

Field of the Disclosure

The present disclosure relates to a semiconductor structure, and in particular, to a semiconductor structure with a doped compound semiconductor layer.

Description of the Related Art

Gallium nitride-based (GaN-based) semiconductor materials have many excellent characteristics, for example, a high thermal resistance, a wide band-gap, and a high electron saturation rate. Therefore, GaN-based semiconductor materials can be applied to high-speed and high-temperature operating environments. In recent years, GaN-based semiconductor materials have been widely used in light-emitting diode (LED) elements and high-frequency elements, such as high electron mobility transistors (HEMT) with structures of heterogeneous interfaces.

During manufacturing process of a HEMT, semiconductor materials of the HEMT may be adversely affected by the environment, such as the temperature or elements in the environment, resulting in deactivation of the semiconductor materials and lower gate controllability of the device. This may further degrade the capability to drive current and impact the electrical uniformity of products in different batches fabricated in the same or similar processes.

With developments of GaN-based semiconductor materials, those semiconductor devices with GaN-based semiconductor materials are used in harsh working conditions, such as higher frequencies, higher temperatures or higher voltages. Therefore, semiconductor devices with GaN-based semiconductor materials still need to be improved to overcome the challenges.

SUMMARY

An embodiment of the present disclosure provides a semiconductor structure, which includes a substrate, a channel layer, a barrier layer, a source structure, a drain structure, a doped compound semiconductor layer, a dielectric layer, and a gate structure. The channel layer is disposed on the substrate. The barrier layer is disposed on the channel layer. The source structure and the drain structure are disposed on opposite sides of the barrier layer. The doped compound semiconductor layer is disposed on the barrier layer. The doped compound semiconductor layer has a first side adjacent to the source structure and a second side adjacent to the drain structure. The doped compound semiconductor layer has at least one opening exposing at least a portion of the barrier layer. The dielectric layer is disposed on the doped compound semiconductor layer and the barrier layer. The gate structure is disposed on the doped compound semiconductor layer.

BRIEF DESCRIPTION OF THE DRAWINGS

The embodiments of the disclosure can be more fully understood by reading the subsequent detailed description and examples with references made to the accompanying drawings. In accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
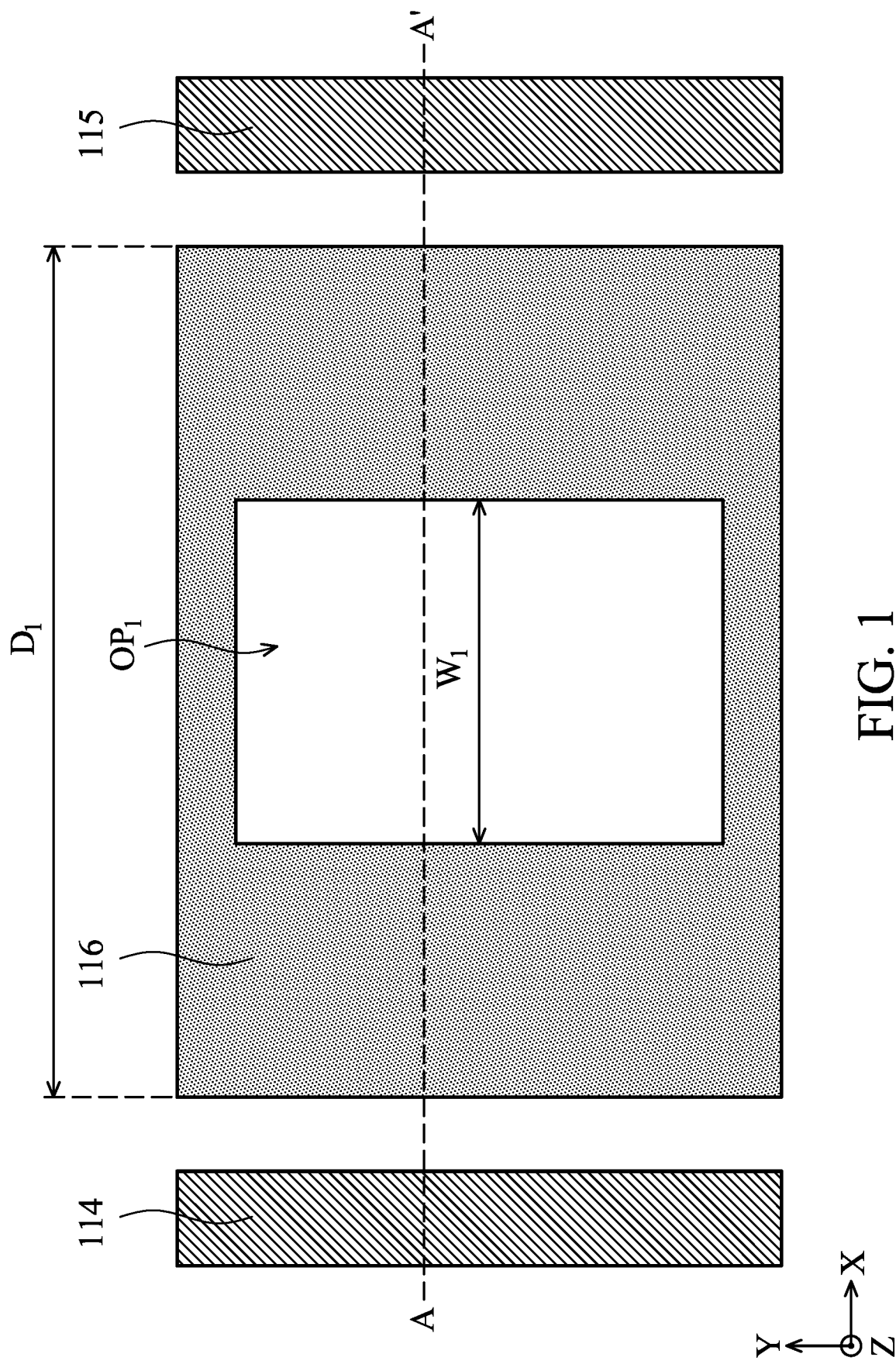
FIG. 1 illustrates a top view of a portion of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described below. Additional operations can be provided before, during, and/or after the stages described in these embodiments. Some of the stages that are described can be replaced or eliminated for different embodiments. Additional features can be added to the semiconductor structure. Some of the features described below can be replaced or eliminated for different embodiments. Although some embodiments are discussed with operations performed in a particular order, these operations may be performed in another logical order. Furthermore, the term "about" means a given value may vary with a specific technology node related to the desired semiconductor device. In some embodiments, based on specific technology nodes, the term "about" may represent, for example, a given value within a range between 10% and 30% of that value, such as within ±10%, ±20%, or ±30% of that value.

The embodiments of the present disclosure provide a semiconductor structure with reduced proportion of the doped compound semiconductor layer in the semiconductor structure, which may improve electrical uniformity and performance of the device. In some embodiments, device performance may be improved through the liner layer or the protection layer disposed on sidewalls of the doped compound semiconductor layer and the barrier layer, or through the liner layer disposed under the source electrode and the drain electrode.

Figure 2:
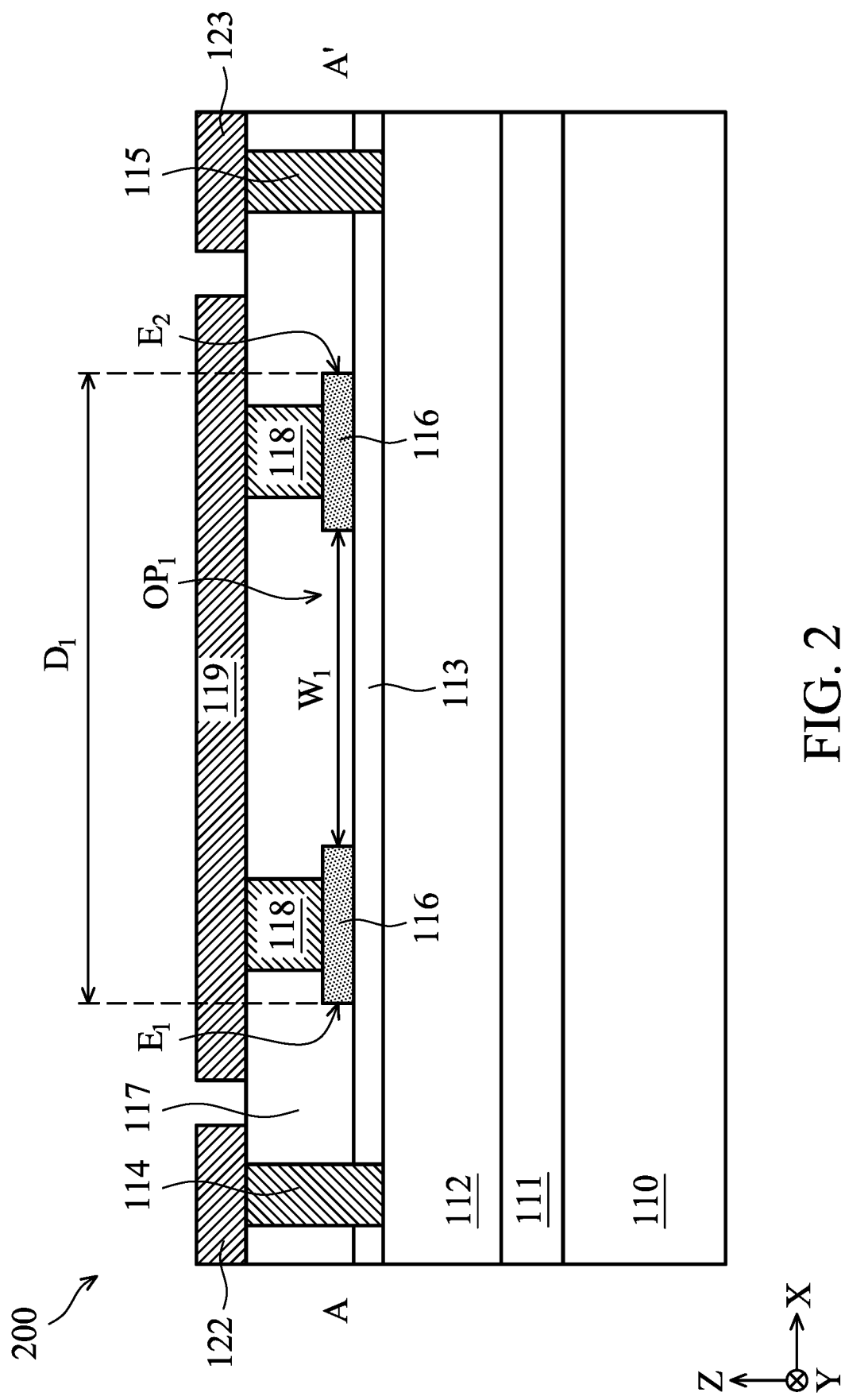
FIG. 2 illustrates a cross-sectional view of the semiconductor structure along the A-A' line in FIG. 1.

FIG. 1 illustrates a top view of a portion of a semiconductor structure and FIG. 2 illustrates a cross-sectional view of the semiconductor structure along the A-A' line in FIG. 1, in accordance with some embodiments of the present disclosure. The semiconductor structure 200 includes the substrate 110, the channel layer 112, the barrier layer 113, the source structure containing the source electrode 114 and the source metal layer 122, the drain structure containing the drain electrode 115 and the drain metal layer 123, the doped compound semiconductor layer 116, the dielectric layer 117, and the gate structure containing the gate electrode 118 and the gate metal layer 119. The substrate 110 may be a doped (such as doped with p-type or n-type dopants) or an undoped semiconductor substrate. For example, the substrate 110 may include an elemental semiconductor including Si or Ge; a compound semiconductors including GaAs, GaP, InP, InAs and/or InSb; an alloy semiconductor including SiGe, GaAsP, AlInAs, AlGaAs, GaInAs, GaInP, and/or GaInAsP, or a combination thereof. In some embodiments, the substrate 110 may be a semiconductor-on-insulator substrate, such as a silicon-on-insulator substrate or a silicon germanium-on-insulator (SGOI) substrate. In other embodiments, the substrate 110 may be a ceramic substrate, such as AlN substrate, SiC substrate, $Al_2O_3$ substrate (also referred to as a sapphire substrate), or another substrate. In some embodiments, the substrate 110 may include a ceramic substrate and a pair of blocking layers disposed on the upper and lower surfaces of the ceramic substrate respectively. The material of the ceramic substrate may include a ceramic material, and the ceramic material includes an inorganic metal material. For example, the material of the ceramic substrate may include SiC, AlN, sapphire, or another suitable material. The sapphire substrate may be alumina.

The channel layer 112 is on the substrate 110. In some embodiments, the material of the channel layer may include a binary compound semiconductor of group III-V, such as a nitride of group III. In some embodiments, the material of the channel layer may be GaN. In some embodiments, the channel layer may be doped with n-type or p-type dopants. The channel layer may be formed by an epitaxial growth process, such as MOCVD, hydride vapor phase epitaxy (HVPE), molecular beam epitaxy (MBE), a combination thereof, or the like. In some embodiments, the breakdown voltage of a HEMT is mostly determined by the thickness of the GaN channel layer. For example, the breakdown voltage of a HEMT may be increased by about 100 volts as the thickness of the GaN channel layer is increased by 1 μm. During an epitaxial growth process for forming a GaN layer, a substrate with high thermal conductivity and high mechanical strength should be used to deposit GaN material thereon, otherwise the substrate may be warped or even cracked. Compared to the Si substrate, the AlN substrate has higher thermal conductivity and higher mechanical strength such that a thicker GaN layer may be formed on the AlN substrate. For example, the thickness of the GaN layer formed on the surface of the Si substrate is between about 2 μm and about 4 μm, while the thickness of the GaN layer formed on the surface of the AlN substrate may be between about 5 μm and about 15 μm.

Since the crystal lattice and the coefficient of thermal expansion of the channel layer 112 may be different from those of the substrate 110, strains may occur at or near the interface between the channel layer 112 and the substrate 110, resulting in defects such as cracks or warpage in the channel layer 112. In some embodiments, the semiconductor structure 200 may include the buffer layer 111 between the substrate 110 and the channel layer 112, as shown in FIG. 2. The strains of the channel layer 112 subsequently formed over the buffer layer 111 may be mitigated through the buffer layer 111 to prevent defects from forming in the channel layer 112. The material of the buffer layer 111 may include AlN, GaN, $Al_xGa_{1-x}N$ (0<x<1), a combination thereof, or another material, and may be formed by an epitaxial growth process, such as MOCVD, HVPE, MBE, a combination thereof, or the like.

Although the buffer layer 111 shown in FIG. 2 is a single-layer structure, the buffer layer 111 may be a multi-layer structure (not shown). For example, the buffer layer 111 may include a superlattice buffer layer and/or gradient buffer layer. The superlattice buffer layer may be disposed on the substrate 110 and the gradient buffer layer may be disposed on the superlattice buffer layer, which may effectively prevent dislocations in the substrate 110 from entering the channel region and further improve crystallization quality of other overlying film(s) and/or layer(s). In addition, the superlattice buffer layer and the gradient buffer layer may also be multilayer structures. For example, the superlattice buffer layer may include a plural sets of alternating layers, and each set of the alternating layers may include at least one AlN layer and at least one $Al_xGa_{(1-x)}N$ layer (0≤x<1, depending on the amount of Al) alternately arranged; and the gradient buffer layer may include a plurality of $Al_yGa_{(1-y)}N$ layers (0≤y<1, depending on the amount of Al).

In some embodiments, a seed layer (not shown) may be formed between the substrate 110 and the buffer layer 111. The material of the seed layer may include AlN, $Al_2O_3$, AlGaN, SiC, Al, a combination thereof, or the like. The seed layer may be a single-layer or a multilayer structure. The seed layer may be formed by a process the same as or similar to the epitaxial growth process described above. In some embodiments, the material of buffer layer 111 may be determined by the material of the seed layer and the inflow gas during the epitaxial growth process.

The barrier layer 113 is disposed on the channel layer 112. The material of the barrier layer 113 may include a ternary compound semiconductor of group III-V, such as a nitride of group III. For example, the material of the barrier layer may include AlGaN, AlInN, or a combination thereof. In other embodiments, the barrier layer 113 may include GaN, AlN, GaAs, GaInP, AlGaAs, InP, InAlAs, InGaAs, other suitable material of group III-V, or a combination thereof. In some embodiments, the barrier layer 113 may be doped with, for example, n-type or p-type dopants. The barrier layer may be formed by an epitaxial growth process, such as MOCVD, HVPE, MBE, a combination thereof, or a similar process. According to some embodiments of the present disclosure, the material of the channel layer 112 is different from that of the barrier layer 113, and thereby the interface between the channel layer 112 and the barrier layer 113 is a heterojunction structure. The lattice mismatch between the channel layer 112 and barrier layer 113 may result in stress that leads to piezoelectric polarization effect. Besides, the ionicity of the bonding between the metal of group III (e.g. Al, Ga, or In) and nitrogen is relatively strong, resulting in spontaneous polarization. Due to the difference in energy gap between the channel layer 112 and the barrier layer 113, the piezoelectric polarization and spontaneous polarization described above, two-dimensional electron gas (2DEG) (not shown) is formed at the heterogeneous interface between the channel layer 112 and the barrier layer 113. In some embodiments of the present disclosure, some semiconductor devices are HEMTs by using 2DEG as conductive carriers.

Referring to FIG. 2, the doped compound semiconductor layer 116 is disposed on the barrier layer 113. The doped compound semiconductor layer 116 has the side $E_1$ adjacent to the source structure, the side $E_2$ adjacent to the drain structure, and the opening $OP_1$. The distance between the side $E_1$ and the side $E_2$ is $D_1$ and the width of the opening $OP_1$ is $W_1$. A portion of the barrier layer 113 is exposed through the opening $OP_1$. The doped compound semiconductor layer 116 may inhibit the generation of 2DEG under the gate electrode 118 to be formed thereon and a normally-off status for the semiconductor device is attained. During the process, the doped compound semiconductor layer 116 may be deactivated due to the environment (e.g. temperature or elements in the environment). In some embodiments of the present disclosure, the doped compound semiconductor layer 116 with the opening $OP_1$ may reduce the area of the compound semiconductor layer 116 in semiconductor structure 200 to lower the proportion of the compound semiconductor layer 116 in design, thereby obviating the performance degradation of the device due to the impact of environmental factors on the doped compound semiconductor layer 116 during the process. In some embodiments, the width $W_1$ of the opening the $OP_1$ is between ⅓ and ⅔ of the distance $D_1$ between the side $E_1$ and the side $E_2$ such that the performance degradation of the device described above may be obviated without substantially changing the function and properties of the doped compound semiconductor layer 116. In addition, since the area of the doped compound semiconductor layer 116 is reduced, the degradation of controllability of the gate electrode 118 under the impact of environmental factors acting on the doped compound semiconductor layer 116 is obviated to improve the capability to drive current.

According to some embodiments of the present disclosure, the material of the doped compound semiconductor layer 116 may include GaN doped with p-type or n-type dopants. The thickness of the doped compound semiconductor layer 116 may be in a range from about 50 nm to about 150 nm. The steps for forming the doped compound semiconductor layer 116 may include depositing a doped compound semiconductor material layer on the barrier 113 thorough an epitaxial growth process and forming a patterned mask layer on the doped compound semiconductor material layer, performing an etching process on the doped compound semiconductor material layer to remove portions of the doped compound semiconductor material layer uncovered by the patterned mask layer, and thereby forming the doped compound semiconductor layer 116 corresponding to where the gate electrode 118 is to be formed. The patterned mask layer is then removed. The patterned mask layer may be hard mask or photoresist. In some embodiments, the doped compound semiconductor material layer may be in-situ deposited in the same deposition chamber as the seed layer, the buffer layer 111, and the barrier layer 113. In addition, the doped compound semiconductor layer 116 may have a rectangular cross-section as shown in FIG. 2, or may have a cross-section of another shape, such as a trapezoidal shape. Furthermore, the upper surface of the doped compound semiconductor layer 116 may not be flat.

In other embodiments, the doped compound semiconductor layer 116 may include other semiconductors of group III-V dope with p-type dopants, such as AlGaN, AN, GaAs, AlGaAs, InP, InAlAs, or InGaAs. Further, the doped compound semiconductor layer 116 may include other semiconductors of group II-VI dope with p-type dopants, such as CdS, CdTe, or ZnS. In some embodiments, the doped compound semiconductor layer 116 may be doped with an element such as Li, Be, C, Na, Mg, Zn, Ca, Sr, Ba, Ra, Ag and so on, and thereby the doped compound semiconductor layer 116 is p-type doped.

Still referring to FIG. 2, the dielectric layer 117 is disposed on the barrier layer 113 and the doped compound semiconductor layer 116, the gate electrode 118 is disposed on the doped compound semiconductor layer 116 and embedded in the dielectric layer 117, and the gate metal layer 119 is disposed on the dielectric layer 117 and may be used as a gate field plate. As described above, the gate electrode 118 is disposed on the doped compound semiconductor layer 116, and the generation of 2DEG under the gate electrode 118 may be inhibited by the doped compound semiconductor layer 116 to attain a normally-off status for the semiconductor device. The dielectric layer 117 may include a single layer or multiple layers of one or more dielectric materials, such as silicon oxide, silicon nitride, silicon oxynitride, tetraethoxysilane (TEOS), phosphosilicate glass (PSG), borophosphosilicate glass (BPSG), low-k dielectric material, and/or another suitable dielectric material. The low-k dielectric material may include (but is not limited to) fluorinated silica glass (FSG), hydrogen silsesquioxane (HSQ), carbon-doped silicon oxide, amorphous fluorinated carbon, parylene, bis-benzocyclobutenes (BCB), or polyimide. The dielectric layer 117 may be formed by, for example, spin-coating, chemical vapor deposition (CVD), atomic layer deposition (ALD), high-density plasma chemical vapor deposition (HDPCVD), other suitable methods, or a combination thereof.

The material of the gate electrode 118 may include a conductive material, such as metal, metal nitride, or semiconductor material. For example, the metal may include Au, Ni, Pt, Pd, Ir, Ti, Cr, W, Al, Cu, other suitable material, a combination thereof, or multiple layers thereof; the metal nitride may include MoN, WN, TiN, TaN, or another suitable material; the semiconductor material may include polycrystalline silicon or polycrystalline germanium. The conductive material may be formed by a deposition process, such as CVD, ALD, or physical vapor deposition (PVD) (e.g. sputtering or evaporation), and then the conductive material is patterned to form the gate electrode 118. In some embodiments, the gate metal layer 119 may be formed by a similar method. The gate metal layer 119 may include a material the same as or similar to the material of the gate electrode 118, and may be formed in the same process or in different processes. The material of the gate metal layer 119 may include NiSi, CoSi, TaC, TaSiN, TaCN, TiAl, TiAlN, metal oxide, metal alloy, other suitable conductive materials, or a combination thereof.

As shown in FIG. 2, the source structure and the drain structure are disposed on opposing sides of the barrier layer 113. The source structure may include the source electrode 114 and the source metal layer 122 disposed on the source electrode 114, and the drain structure may include the drain electrode 115 and the drain metal layer 123 disposed on the drain electrode 115. In some embodiments, the method for forming the source electrode 114 and the drain electrode 115 includes performing a patterning process on the barrier layer to form a pair of openings (or more openings) in the barrier layer, filling a conductive material into the openings, performing a planarization process (such as chemical mechanical polishing) or an etch-back process to remove excess material outside the openings, and thereby forming the source electrode 114 and drain electrode 115. In other embodiments, the source electrode 114 and drain electrode 115 may be formed through a similar process as described above after the formation of the dielectric layer 117. The material and method of forming the conductive material is similar to those of the conductive material of the gate electrode 118. In some embodiments, the source metal layer 122 or the drain metal layer 123 may be formed by a similar method in the subsequent process. According to some embodiments of the present disclosure, the method of forming the gate electrode 118 may be similar to the method of forming the source electrode 114 and the drain electrode 115.

In some embodiments, the source metal layer 122 may be directly on and in direct contact with the source electrode 114, or may be electrically connected to the source electrode 114 through a contact. Similarly, the drain metal layer 123 may be directly on and in direct contact with the drain electrode 115, or may be electrically connected to the drain electrode 115 through a contact. For example, the source electrode 114 of the source structure is embedded in the dielectric layer 117, the source metal layer 122 of the source structure may be disposed on the dielectric layer 117, and the source electrode 114 and the source metal layer 122 are electrically connected through a source contact embedded in the dielectric layer 117. The potential of the source metal layer 122 electrically connected to the source electrode 114 is different from the potential of the gate metal layer 119 electrically connected to the gate electrode 118. In these embodiments, the source metal layer 122 extends along a direction from the source structure to the drain structure and functions as a source field plate, thereby reducing the intensity of electric field. In other embodiments, the source electrode 114 and the drain electrode 115 may penetrate through the barrier layer 113 and contact with the channel layer 112. The source metal layer 122 and the drain metal layer 123 may include the same or a similar material as the source electrode 114 and the drain electrode 115, and may be formed in the same process or in different processes. In some embodiments, the material of the source metal layer 122 and the drain metal layer 123 may include NiSi, CoSi, TaC, TaSiN, TaCN, TiAl, TiAlN, metal oxide, metal alloy, other suitable conductive materials, or a combination thereof.

As described above, the doped compound semiconductor layer 116 may be deactivated due to influence of the environment (e.g. temperature or elements in the environment) during the process. The deactivation may degrade the controllability of the gate electrode 118 and thereby reduce the capability to drive current. Therefore, to reduce the proportion of the doped compound semiconductor layer 116 in device design, some embodiments of the present disclosure provide a doped compound semiconductor layer 116 with the opening $OP_1$, which may reduce the area of the compound semiconductor layer 116 in the semiconductor structure 200. This may obviate the lower controllability of the gate electrode 118 under the impact of environmental factors acting on the doped compound semiconductor layer 116 and improve the capability to drive current and electrical uniformity. For example, in the same condition (for example, the same voltage), the doped compound semiconductor layer 116 with the opening $OP_1$ may increase the driving current of the device by about 25% or more. According to some embodiments, the width $W_1$ is between ⅓ and ⅔ of the distance $D_1$ between the side $E_1$ and the side $E_2$ such that the degradation of controllability of the gate electrode 118 described above may be obviated without substantially changing the function and properties of the doped compound semiconductor layer 116, and the capability to drive current may be improved.

In some embodiments, the semiconductor structure 200 may further include a protection layer and a liner layer (not shown). The protection layer may be disposed on sidewalls and partial upper surface of the doped compound semiconductor layer 116, and on partial upper surface of the barrier layer 113. In some embodiments, the protection layer may repair the lattice defects on the sidewalls of the doped compound semiconductor layer 116 caused by the etch process and thereby reduce the gate leakage current of the resulting semiconductor device. Furthermore, the protection layer formed on partial upper surface of the barrier layer 113 may prevent the barrier layer 113 from oxidation to enhance the performance of the resulting semiconductor device. Depending on the requirement of process or device design, the thickness of the protection layer may be in a range from about 0.5 nm to about 500 nm. The material of the protection layer may include an insulation material or a dielectric material, such as $SiO_2$, SiN, SiON, $Al_2O_3$, AlN, MgO, $Mg_3N_2$, ZnO, $TiO_2$, a combination thereof, or similar materials.

In some embodiments, the material of the protection layer may include nitride, such as silicon nitride or aluminum nitride, which may preferably repair the lattice defects on the sidewalls of the doped compound semiconductor layer 116. In some embodiments, a layer of the above material may be formed on the substrate 110 by CVD, plasma enhanced CVD (PECVD), ALD, PVD (such as sputtering), or the like, and the material layer may be patterned to form the protection layer. In other embodiments, the protection layer on the upper surface of the doped compound semiconductor layer 116 may be entirely removed by a patterning process such that the protection layer is on sidewalls of the doped compound semiconductor layer 116 and on the upper surface of the barrier layer 113.

In some embodiments, the liner layer may be disposed on bottoms and partial sidewalls of the source electrode 114 and the drain electrode 115, and on partial upper surface of the barrier layer 113. In some embodiments, the liner layer may be helpful to generate more 2DEG on the heterogeneous interfaces of the source electrode 114 and the drain electrode 115. This may reduce the contact resistance ($R_{contact}$) between the source electrode 114/drain electrode 115 and the channel layer 112 and further reduce the on-state resistance of the semiconductor structure. Furthermore, the liner layer formed on the upper surface of the barrier layer 113 may prevent the barrier layer 113 from oxidation and thereby improve the performance of the device.

In some embodiments, the material of the liner layer may include a binary compound semiconductor with hexagonal crystal structure, such as AlN, ZnO, InN, a combination thereof, or a similar material, and may be formed by ALD or an epitaxial growth process, such as MOCVD. In an embodiment where the liner layer is formed by MOCVD, since MOCVD is a selective area growth (SAG) process, the liner layer is formed on portions of the barrier layer 113 uncovered by the protection layer and interfaces with the protection layer without being formed on the protection layer. In another embodiment where the liner layer is formed by ALD, the liner layer is formed on portions of the barrier layer 113 uncovered by the protection layer and extends onto the protection layer. Besides, in some other embodiments, the material of the liner layer may include graphene with hexagonal crystal structure, and the liner layer may be formed by CVD or ALD. In some embodiments, the material of the liner layer may be the same as the material of the protection layer, for example, both are AlN. In other embodiments, the material of the liner layer is different from the material of the protection layer, for example, the liner layer is AlN and the protection layer is SiN.

Figure 3:
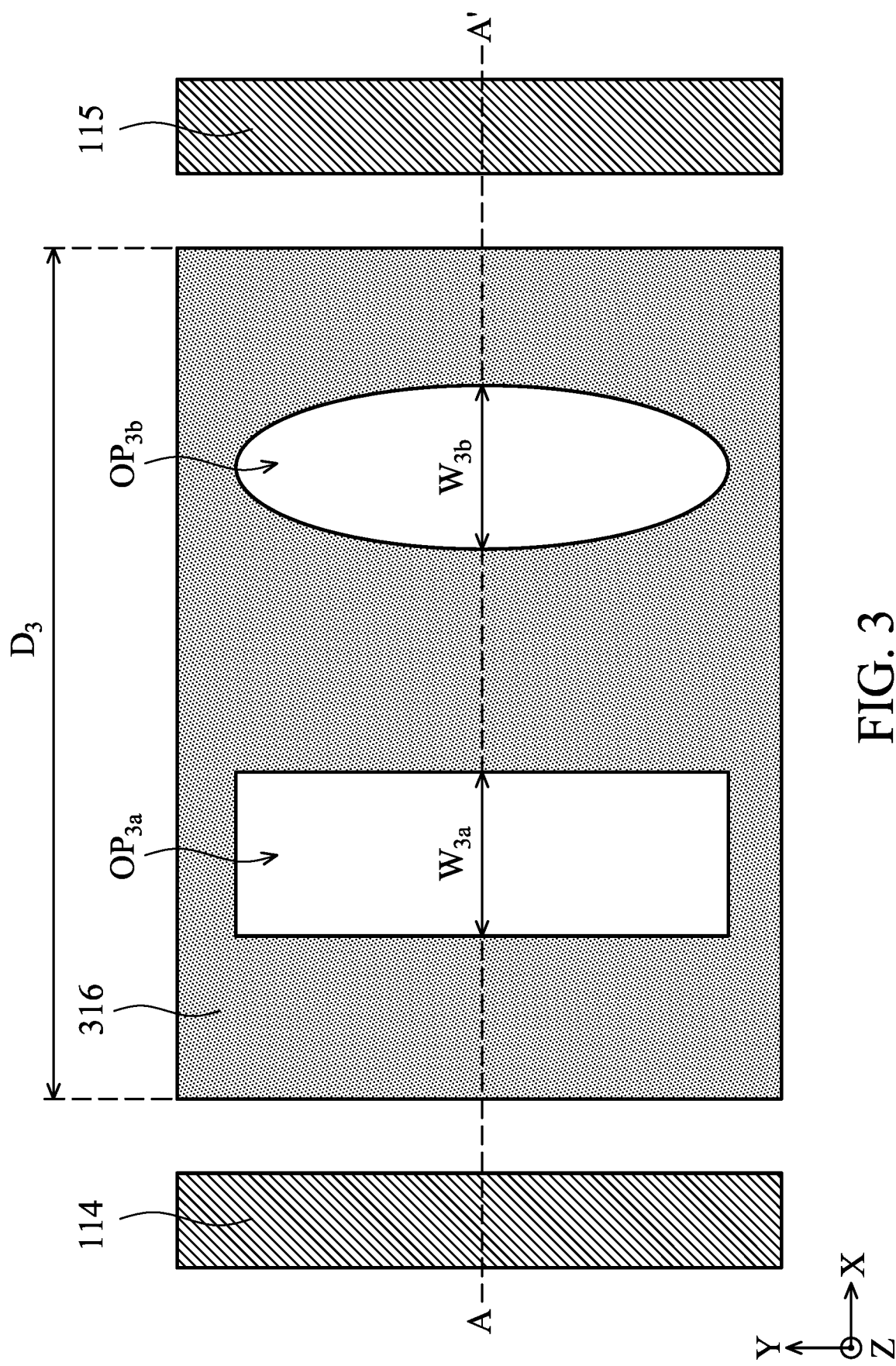
FIG. 3 illustrates a top view of a portion of a semiconductor structure, in accordance with some embodiments of the present disclosure.
Figure 4:
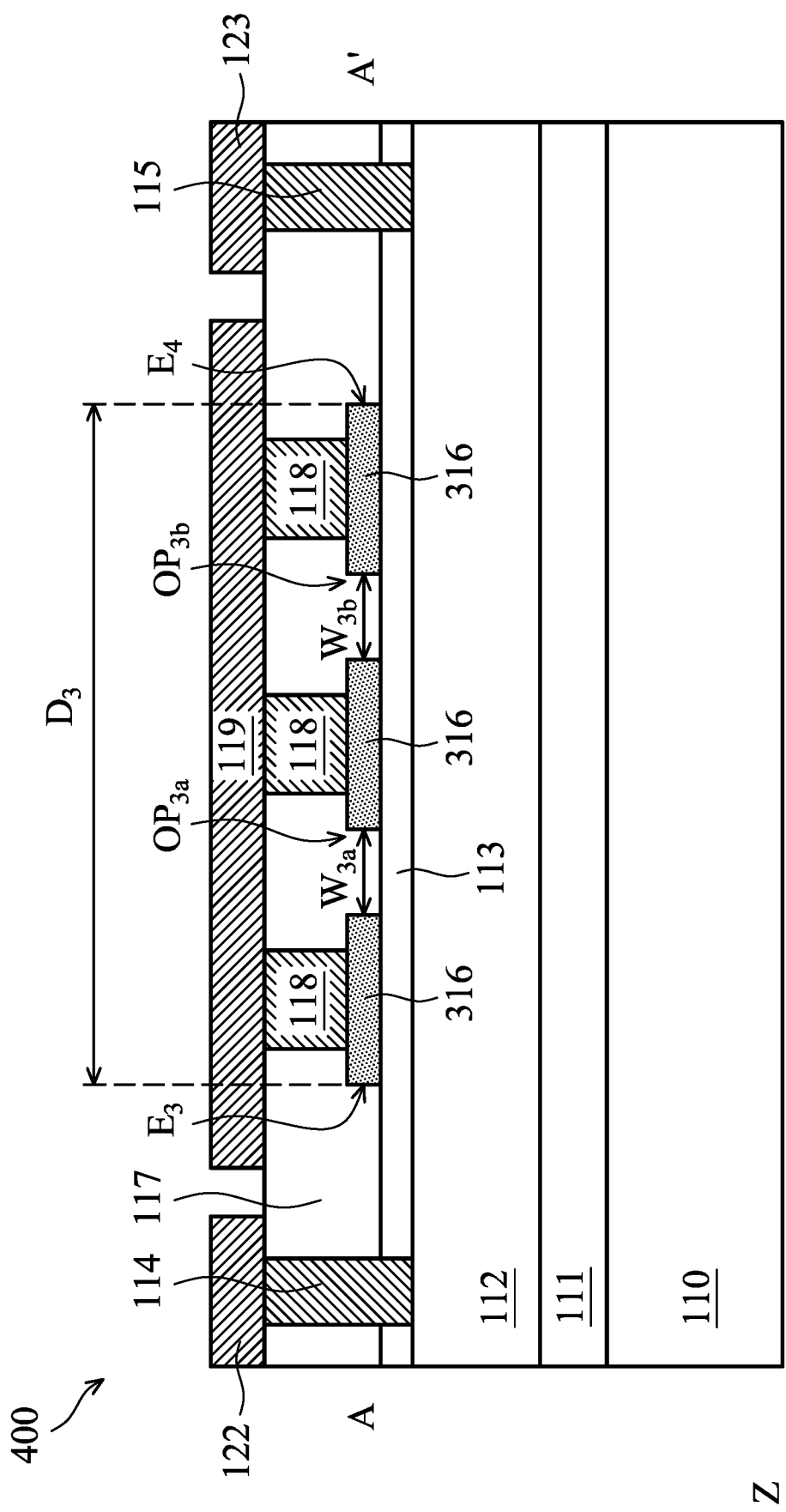
FIG. 4 illustrates a cross-sectional view of the semiconductor structure along the A-A' line in FIG. 3.

FIG. 3 illustrates a top view of a portion of a semiconductor structure and FIG. 4 illustrates a cross-sectional view of the semiconductor structure along the A-A' line in FIG. 3, in accordance with some embodiments of the present disclosure. The semiconductor structure 400 is similar to the semiconductor structure 200 except the doped compound semiconductor layer 316 of the semiconductor structure 400 has two openings. For simplicity, like features in FIG. 4 and FIG. 2 are designated with like reference numerals and the description is not repeated. As shown in FIG. 4, the doped compound semiconductor layer 316 has the side $E_3$ adjacent to the source structure, the side $E_4$ adjacent to the drain structure, and the openings $OP_{3a}$ and $OP_{3b}$. The distance between the side $E_3$ and the side $E_4$ is $D_3$, the width of the opening $OP_{3a}$ is $W_{3a}$, and the width of the opening $OP_{3b}$ is $W_{3b}$. Portions of the barrier layer 113 are exposed through the openings. The semiconductor structure 400 includes the doped compound semiconductor layer 316 with the openings $OP_{3a}$ and $OP_{3b}$, which may reduce the area of the compound semiconductor layer 316 in the semiconductor structure 400. As described above, the degradation of controllability of the gate electrode 118 due under the impact of environmental factors acting on the doped compound semiconductor layer 316 is obviated and the capability to drive current is improved.

According to some embodiments, the sum of the widths $W_{3a}$ and $W_{3b}$ of the respective openings $OP_{3a}$ and $OP_{3b}$ is between ⅓ and ⅔ of the distance $D_3$ between the side $E_3$ and the side $E_4$ such that the degradation of controllability of the gate electrode 118 described above may be obviated without substantially changing the function and properties of the doped compound semiconductor layer 116, thereby improving the capability to drive current. It should be noted that the number of openings shown in FIG. 4 is only an example, and the number of openings of the compound semiconductor layer in the embodiment of the present disclosure may be more than two. In some embodiments where the compound semiconductor layer has more than two openings, the sum of the width of the opening is between ⅓ and ⅔ of the distance between a side of the doped compound semiconductor layer adjacent to the source structure and another side of the doped compound semiconductor layer adjacent to the drain structure. As described above, the controllability of the gate electrode and the capability to drive current may be improved without substantially changing the function and properties of the doped compound semiconductor layer. In some embodiments, the semiconductor structure 400 may also include, for example, a protection layer and/or a liner layer to reduce the leakage current of the resulting semiconductor device and/or the on-state resistance of the semiconductor structure 400, and prevent the surface of the barrier layer 113 from oxidation. This may improve the performance of the resulting device. Further, as shown in FIG. 3, the doped compound semiconductor layer 316 has a rectangular opening the $OP_{3a}$ and an oval opening the $OP_{3b}$. Specifically, in the A-A' direction from the source electrode 114 to the drain electrode 115 (or from the source structure to the drain structure), the doped compound semiconductor layer 316 has two openings $OP_{3a}$ and $OP_{3b}$, and the openings have a maximum sum of widths ($W_{3a}+W_{3b}$) in the A-A' direction. In some embodiments, in order to maintain the function and properties of the doped compound semiconductor layer 316, the maximum sum of the widths ($W_{3a}+W_{3b}$) of the openings $OP_{3a}$ and $OP_{3b}$ in the A-A' direction is between ⅓ and ⅔ of the maximum width $D_3$ of the doped compound semiconductor layer 316 in the A-A' direction, and the minimum distance between the openings $OP_{3a}$ and $OP_{3b}$ in the A-A' direction is the average of the widths of the openings $OP_{3a}$ and $OP_{3b}$ in the A-A' direction, that is ($W_{3a}+W_{3b}$)/2. As described above, the doped compound semiconductor layer 316 with openings may improve the gate controllability of the device and enhance the capability to drive current.

Figure 5:
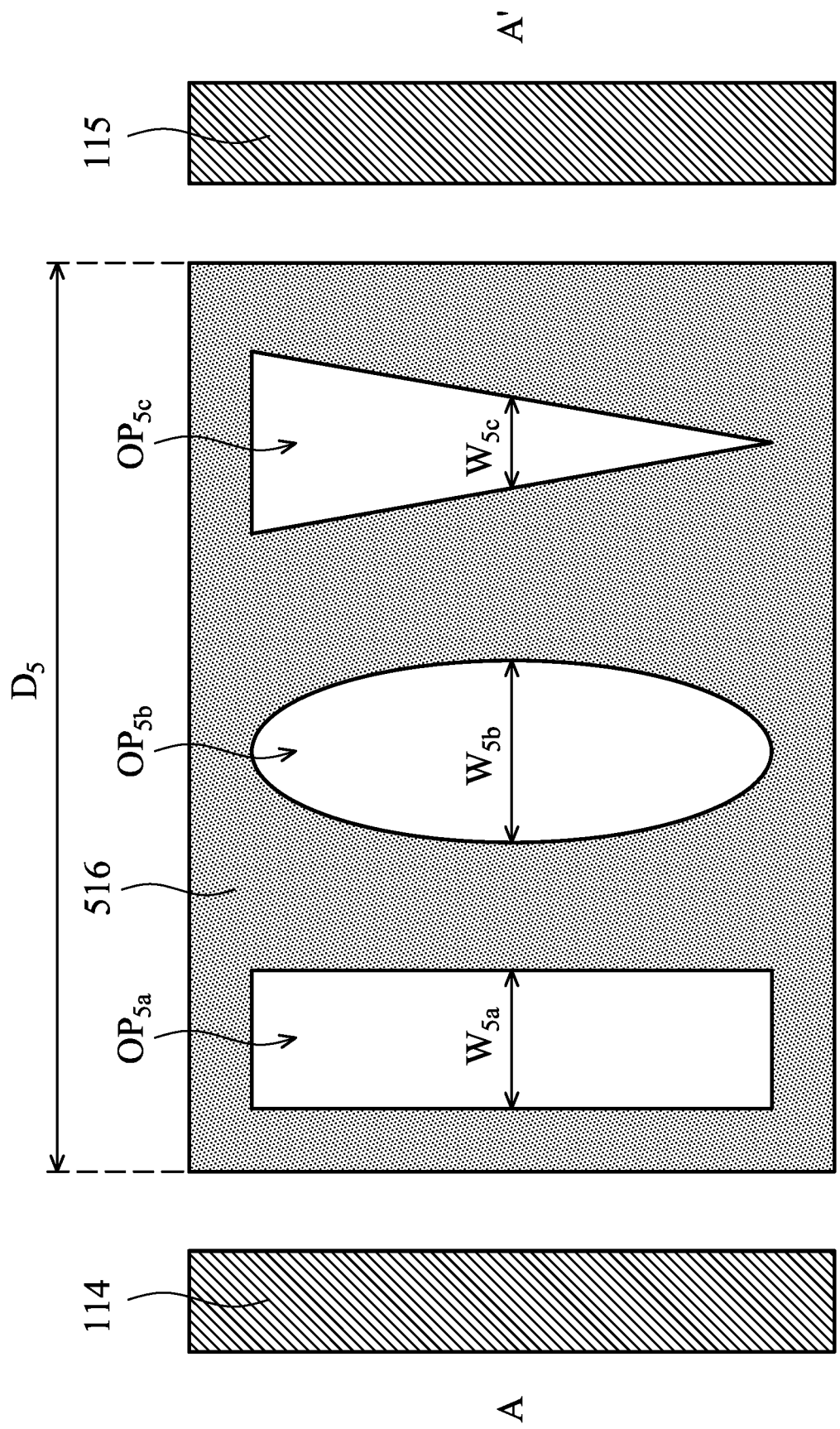
FIGS. 5-11 illustrate top views of portions of semiconductor structures, in accordance with other embodiments of the present disclosure.

FIGS. 5-11 illustrate top views of portions of semiconductor structures, in accordance with some varied embodiments of the present disclosure. Referring to FIG. 5, the semiconductor structure includes the source electrode 114, the drain electrode 115, and the doped compound semiconductor layer 516. As shown in the top view, the doped compound semiconductor layer 516 has the rectangular opening $OP_{5a}$, the oval opening $OP_{5b}$, and the triangle opening $OP_{5c}$. Specifically, in the A-A' direction from the source electrode 114 to the drain electrode 115 (or from the source structure to the drain structure), the doped compound semiconductor layer 516 has three openings $OP_{5a}$, $OP_{5b}$, and $OP_{5c}$, and the openings have a maximum sum of widths ($W_{5a}+W_{5b}+W_{5c}$) in the A-A' direction. In some embodiments, for maintaining the function and properties of the doped compound semiconductor layer 516, the maximum sum of widths ($W_{5a}+W_{5b}$ $W_5O$ in the A-A' direction is between ⅓ and ⅔ of the maximum width $D_5$ of the doped compound semiconductor layer 516 in the A-A' direction, and the minimum distance between adjacent ones of the three openings $OP_{5a}$, $OP_{5b}$, and $OP_{5c}$ in the A-A' direction is the average of the widths of the openings $OP_{5a}$, $OP_{5b}$, and $OP_{5c}$ in the A-A' direction, which is ($W_{5a}+W_{5b}$ $W_{5c}$)/3. The doped compound semiconductor layer 516 with openings may improve the gate controllability of the device and enhance the capability to drive current.

Figure 6:
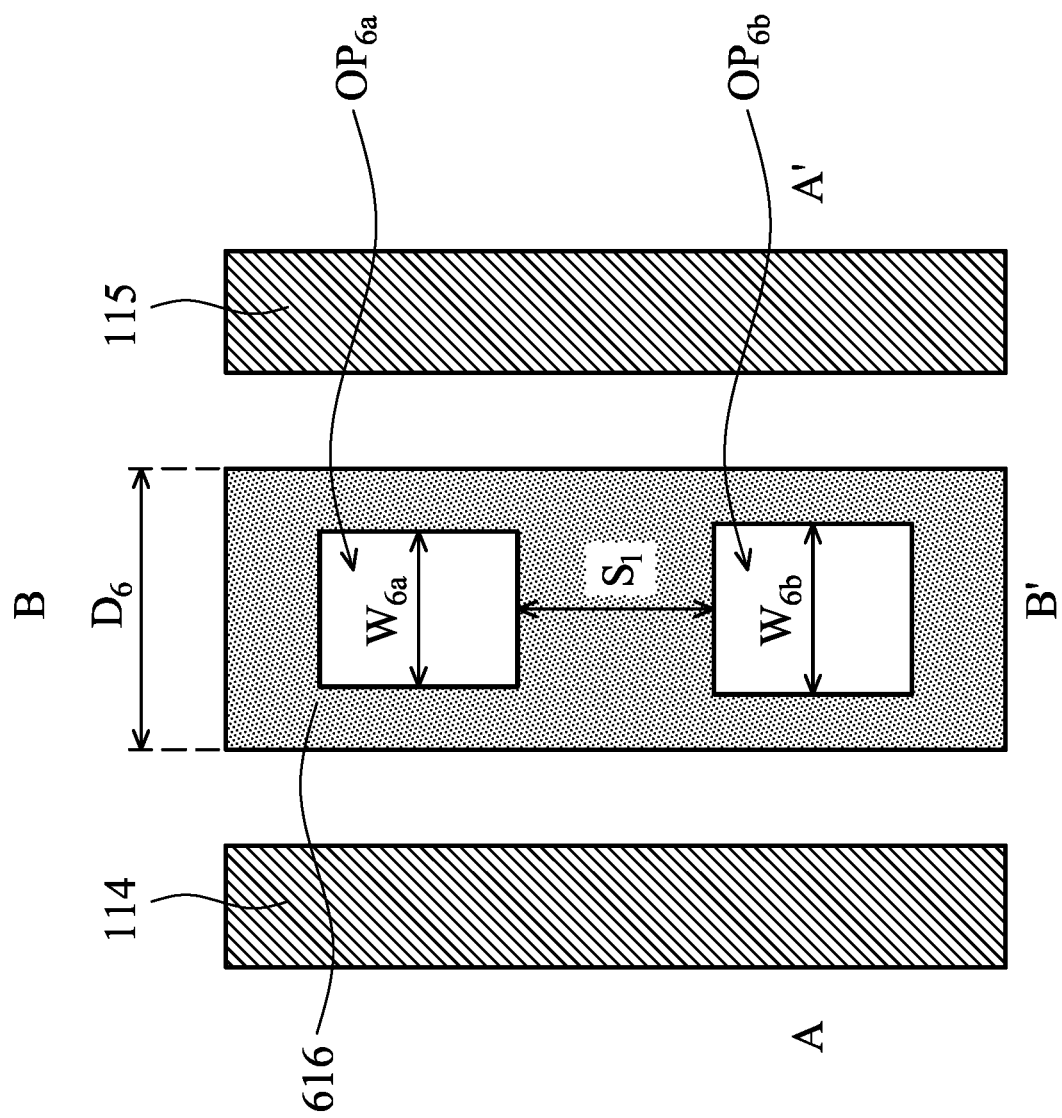

Referring to FIG. 6, the semiconductor structure includes the source electrode 114, the drain electrode 115, and the doped compound semiconductor layer 616. As shown in the top view, the doped compound semiconductor layer 616 has the rectangular openings $OP_{6a}$ and $OP_{6b}$. In the A-A' direction from the source electrode 114 to the drain electrode 115 (or from the source structure to the drain structure), at least a portion of the doped compound semiconductor layer 616 is discontinuous. The opening $OP_{6a}$ has a width $W_{6a}$ in a direction parallel to the A-A' direction, and in the A-A' direction, the opening $OP_{6b}$ has a width $W_{6b}$ greater than the width $W_{6a}$. In some embodiments, for maintaining the function and properties of the doped compound semiconductor layer 616, the greater width $W_{6b}$ of the opening $OP_{6b}$ is between ⅓ and ⅔ of the maximum width $D_6$ of the doped compound semiconductor layer 616 in the A-A' direction, and the minimum value of the spacing $S_1$ between the openings $OP_{6a}$ and $OP_{6b}$ in the B-B' direction perpendicular to the A-A' direction is ½ of the maximum width $D_6$ of the doped compound semiconductor layer 616 in the A-A' direction. As discussed above, the doped compound semiconductor layer 616 with openings may improve the gate controllability of the device and enhance the capability to drive current.

Figure 7:
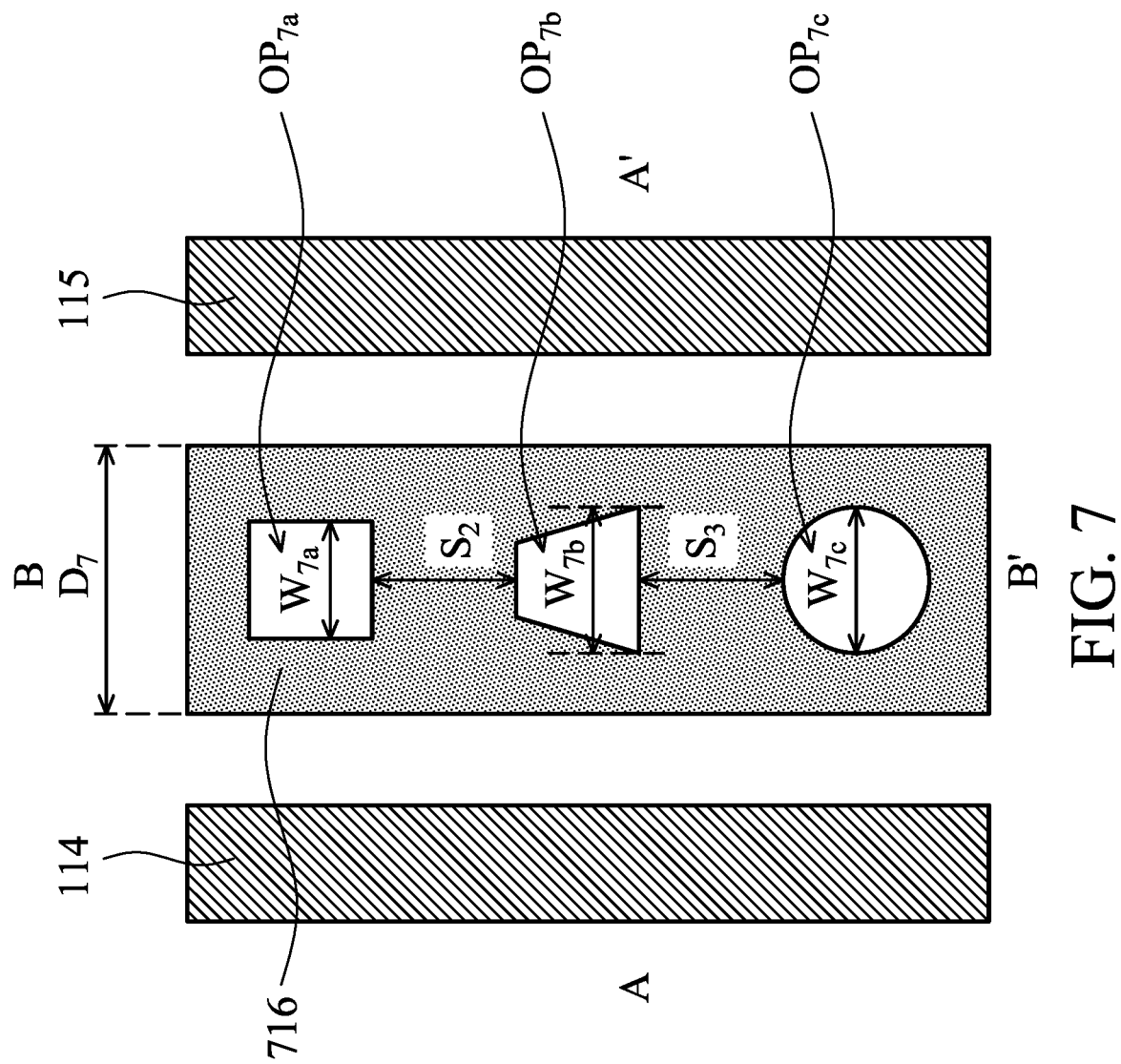

Referring to FIG. 7, the semiconductor structure includes the source electrode 114, the drain electrode 115, and the doped compound semiconductor layer 716. As shown in the top view, the doped compound semiconductor layer 716 has the rectangular opening $OP_{7a}$, the trapezoidal opening $OP_{7b}$, and the circle opening $OP_{7c}$. In the A-A' direction from the source electrode 114 to the drain electrode 115 (or from the source structure to the drain structure), at least a portion of the doped compound semiconductor layer 716 is discontinuous. The opening $OP_{7a}$ has a width $W_{7a}$ in a direction parallel to the A-A' direction, the wider bottom of the opening $OP_{7b}$ has a width $W_{7b}$ in the A-A' direction, the opening $OP_{7c}$ has a width $W_{7c}$ in another direction parallel to the A-A' direction, and the width $W_{7b}$ is greater than the widths $W_{7a}$ and $W_{7b}$. In some embodiments, for maintaining the function and properties of the doped compound semiconductor layer 716, the greater width $W_{7b}$ is between ⅓ and ⅔ of the maximum width $D_7$ of the doped compound semiconductor layer 716 in the A-A' direction. In addition, the minimum value of the spacing $S_2$ between the openings $OP_{7a}$ and $OP_{7b}$ and the minimum value of the spacing $S_3$ between the openings $OP_{7b}$ and $OP_{7c}$ in the B-B' direction perpendicular to the A-A' direction are ½ of the maximum width $D_7$ of the doped compound semiconductor layer 716 in the A-A' direction. As discussed above, the doped compound semiconductor layer 716 with openings may improve the gate controllability of the device and enhance the capability to drive current.

The shapes of the openings of the doped compound semiconductor layer described above are only examples and not limited. The shapes of the openings may include a rectangle, diamond, trapezoid, circle, oval, triangle, or a combination thereof. Besides, the embodiments of the present disclosure may also be applied to openings with irregular shapes.

Figure 8:
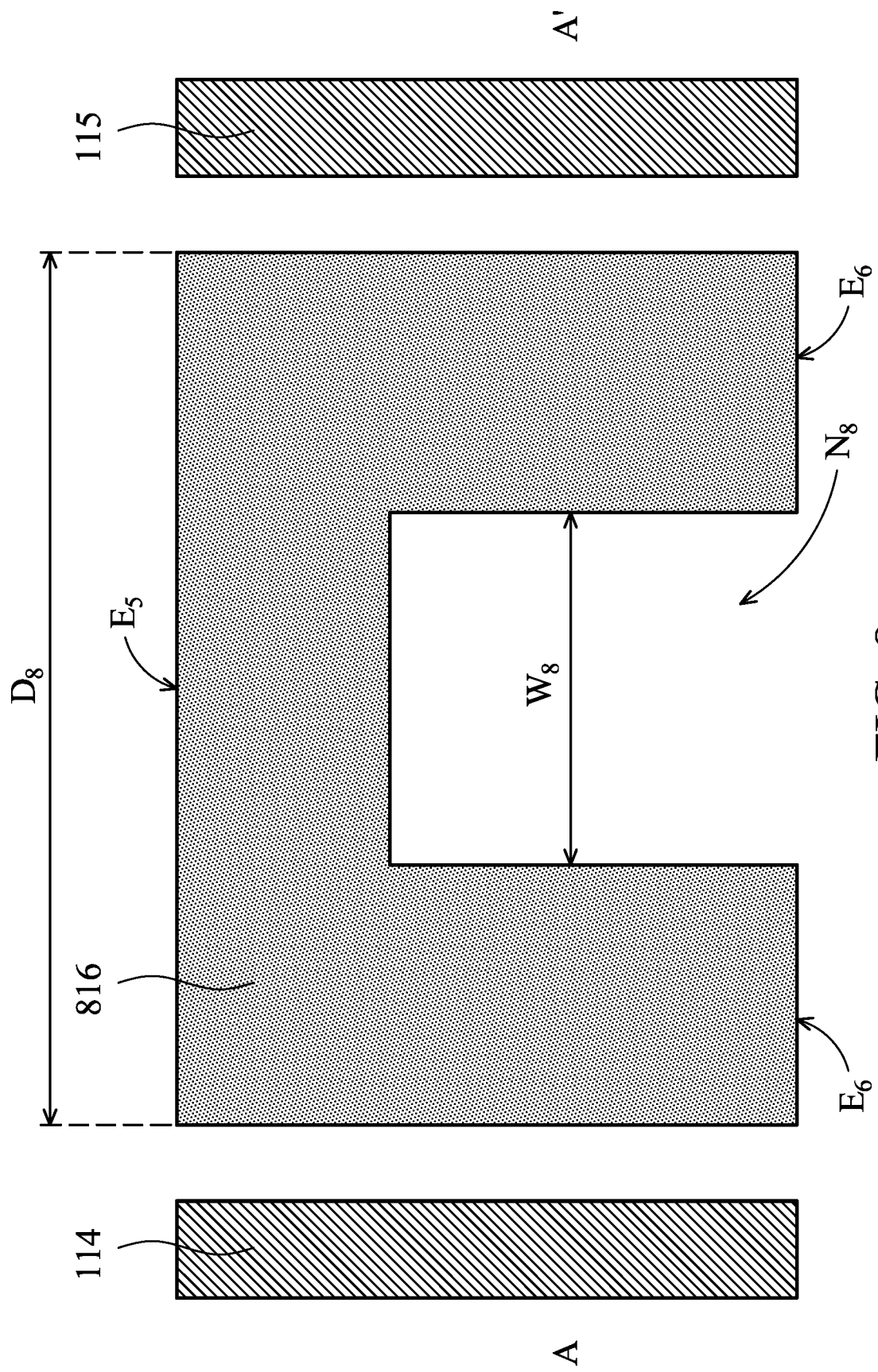

In addition to the openings, the doped compound semiconductor layer may have at least one notch (or namely opening) on at least one of the two sides $E_5$ and $E_6$ parallel to the A-A' direction, as shown in FIG. 8. The semiconductor structure includes the source electrode 114, the drain electrode 115, and the doped compound semiconductor layer 816 having a rectangular notch $N_8$. In the A-A' direction from the source electrode 114 to the drain electrode 115 (or from the source structure to the drain structure), at least a portion of the doped compound semiconductor layer 816 is discontinuous. The extension direction of the notch $N_8$ is perpendicular to the A-A' direction and the notch $N_8$ has a maximum width $W_8$ in the A-A' direction. In some embodiments, for maintaining the function and properties of the doped compound semiconductor layer 816, the maximum width $W_8$ of the notch $N_8$ in the A-A' direction is between ⅓ and ⅔ of the maximum width $D_8$ of the doped compound semiconductor layer 816 in the A-A' direction. Through the doped compound semiconductor layer 816 with the notch, the area of the doped compound semiconductor layer in the semiconductor structure may be reduced. Therefore, the degradation of controllability of the gate electrode due to the impact of environmental factors on the doped compound semiconductor layer is obviated to improve the capability to drive current.

Figure 9:
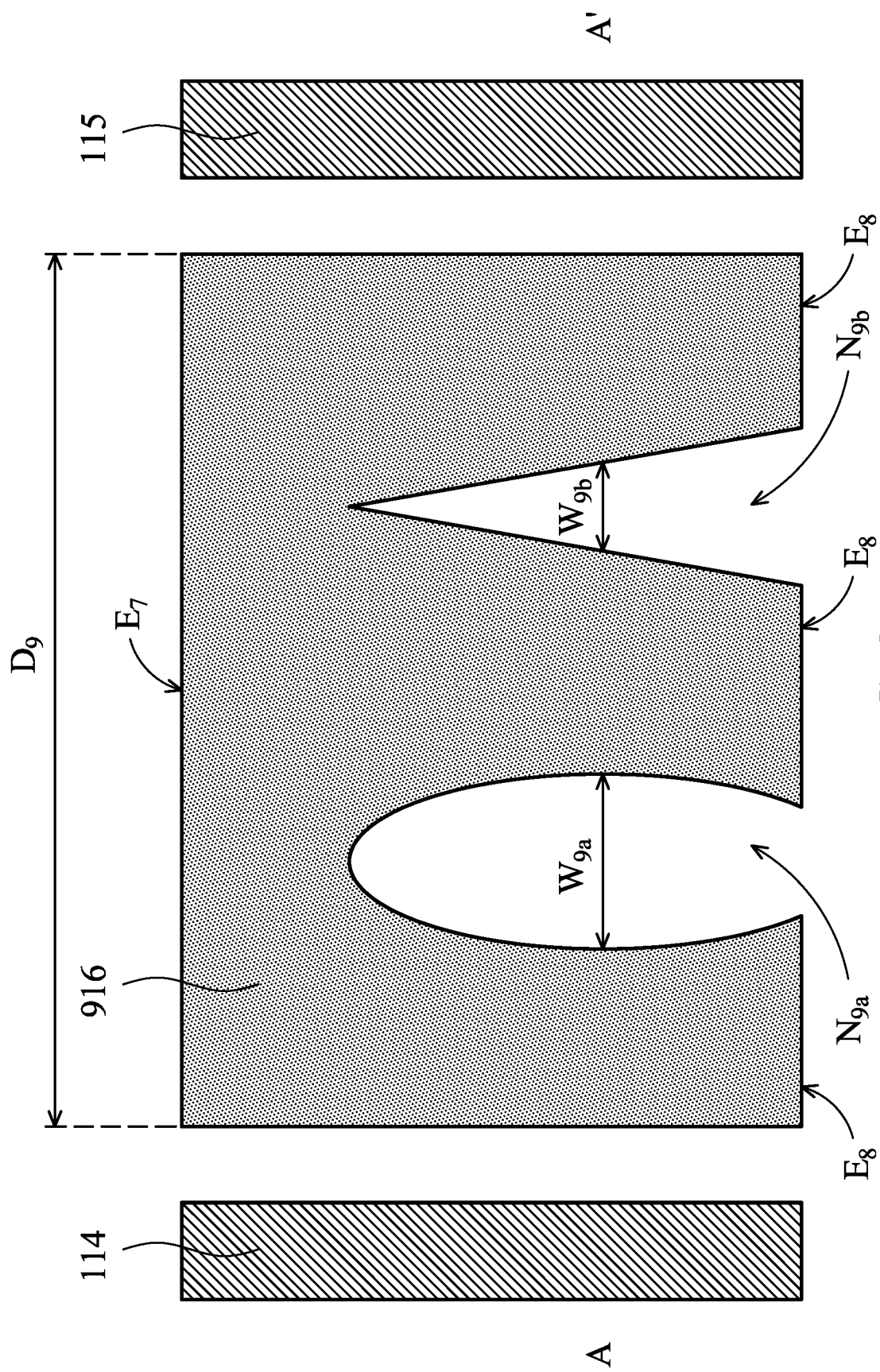

The doped compound semiconductor layer may have more than one notch on at least one of the two sides $E_7$ and $E_8$ parallel to the A-A' direction and form an M-shape or a comb shape, as shown in FIG. 9. The semiconductor structure includes the source electrode 114, the drain electrode 115, and the doped compound semiconductor layer 916 having a notch $N_{9a}$ with a shape of partial oval and a notch $N_{9b}$ with a shape of triangle. In the A-A' direction from the source electrode 114 to the drain electrode 115 (or from the source structure to the drain structure), at least a portion of the doped compound semiconductor layer 916 is discontinuous. The extension directions of the two notches are perpendicular to the A-A' direction and the two notches have a maximum sum of widths $(W_{9a}+W_{9b})$ in the A-A' direction. In some embodiments, in order to maintain the function and properties of the doped compound semiconductor layer 916, the maximum sum of widths $(W_{9a}+W_{9b})$ of the notches in the A-A' direction is between ⅓ and ⅔ of the maximum width $D_9$ of the doped compound semiconductor layer 916 in the A-A' direction, and the minimum distance between the notches $N_{9a}$ and $N_{9b}$ in the A-A' direction is the average of the widths of the notches $N_{9a}$ and $N_{9b}$ in the A-A' direction, that is $(W_{9a}+W_{9b})/2$. The doped compound semiconductor layer 916 with notches may improve the gate controllability of the device and enhance the capability to drive current.

Figure 10:
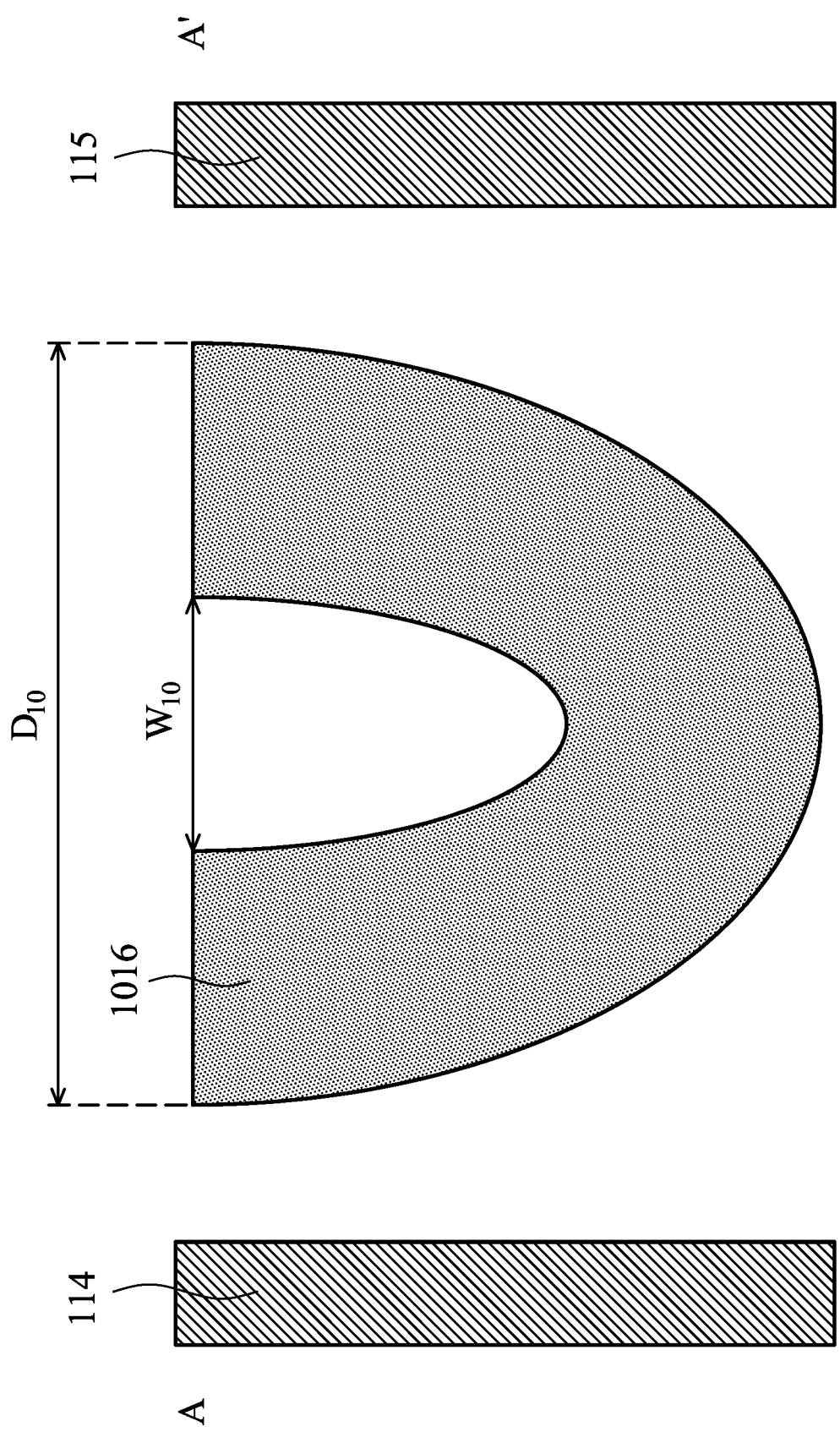

Referring to FIG. 10, the semiconductor structure includes the source electrode 114, the drain electrode 115, and the doped compound semiconductor layer 1016. The doped compound semiconductor layer 1016 is U-shaped as shown in top view. In the A-A' direction from the source electrode 114 to the drain electrode 115 (or from the source structure to the drain structure), at least a portion of the doped compound semiconductor layer 1016 is discontinuous. The extension direction of the notch of the doped compound semiconductor layer 1016 is perpendicular to the A-A' direction and the notch has a maximum width $W_{10}$ in the A-A' direction. In some embodiments, in order to maintain the function and properties of the doped compound semiconductor layer 1016, the maximum width $W_{10}$ of the notch in the A-A' direction is between ⅓ and ⅔ of the maximum width $D_{10}$ of the doped compound semiconductor layer 1016 in the A-A' direction. The doped compound semiconductor layer 1016 with the notch may improve the gate controllability of the device and enhance the capability to drive current as described above.

The shapes of the notches of the doped compound semiconductor layer described above are only examples and not limited. The shapes of the notches may include a rectangle, trapezoid, partial circle, partial oval, triangle, or a combination thereof. The shapes of the doped compound semiconductor layer with notches are not limited, which may include M-shape, U-shape, comb, or a combination thereof.

Figure 11:
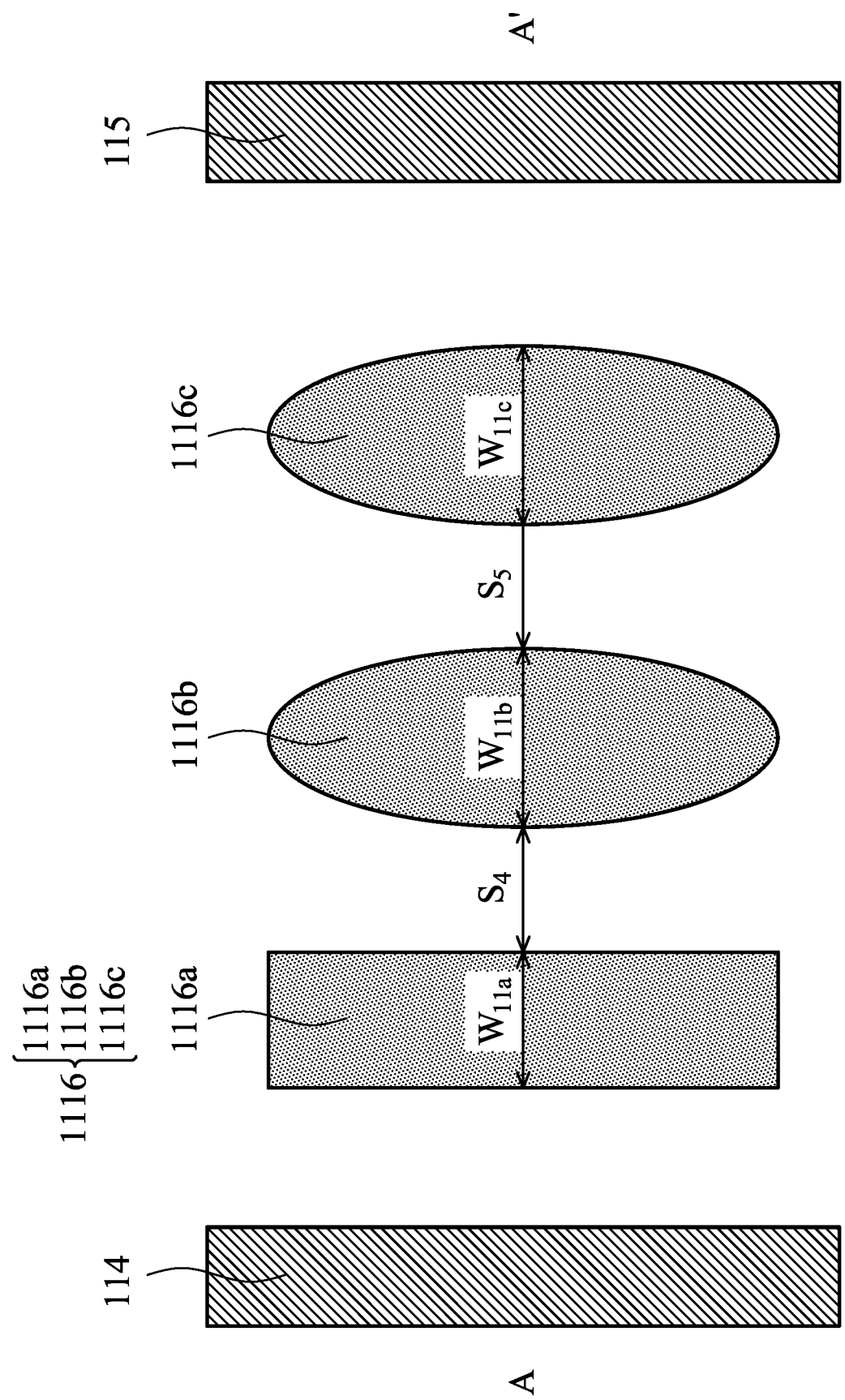

Referring to FIG. 11, the semiconductor structure includes the source electrode 114, the drain electrode 115, and the doped compound semiconductor layer 1116 including a plurality of discrete doped compound semiconductor islands. The doped compound semiconductor islands include the rectangular doped compound semiconductor island 1116a, and the oval doped compound semiconductor islands 1116b and 1116c. In the A-A' direction from the source electrode 114 to the drain electrode 115 (or from the source structure to the drain structure), the doped compound semiconductor layer 1116 is discontinuous, and the doped compound semiconductor islands 1116a, 1116b, and 1116c have a maximum sum of widths $(W_{11a}+W_{11b}+W_{11c})$ in the A-A' direction. In some embodiments, in order to maintain the function and properties of the doped compound semiconductor layer 1116, the maximum sum of widths $(W_{11a}+W_{11b}+W_{11c})$ of the doped compound semiconductor islands 1116a, 1116b, and 1116c in the A-A' direction is between ½ and 2 times the sum of the spacings $(S_4+S_5)$ between the adjacent doped compound semiconductor islands in the A-A' direction. The doped compound semiconductor layer 1116 including a plurality of discrete doped compound semiconductor islands may also reduce the area of the doped compound semiconductor layer in the semiconductor structure, and thereby enhance the capability to drive current. The shapes of doped compound semiconductor islands are only examples and not limited, and may include a rectangle, trapezoid, circle, oval, triangle, or a combination thereof.

Figure 12:
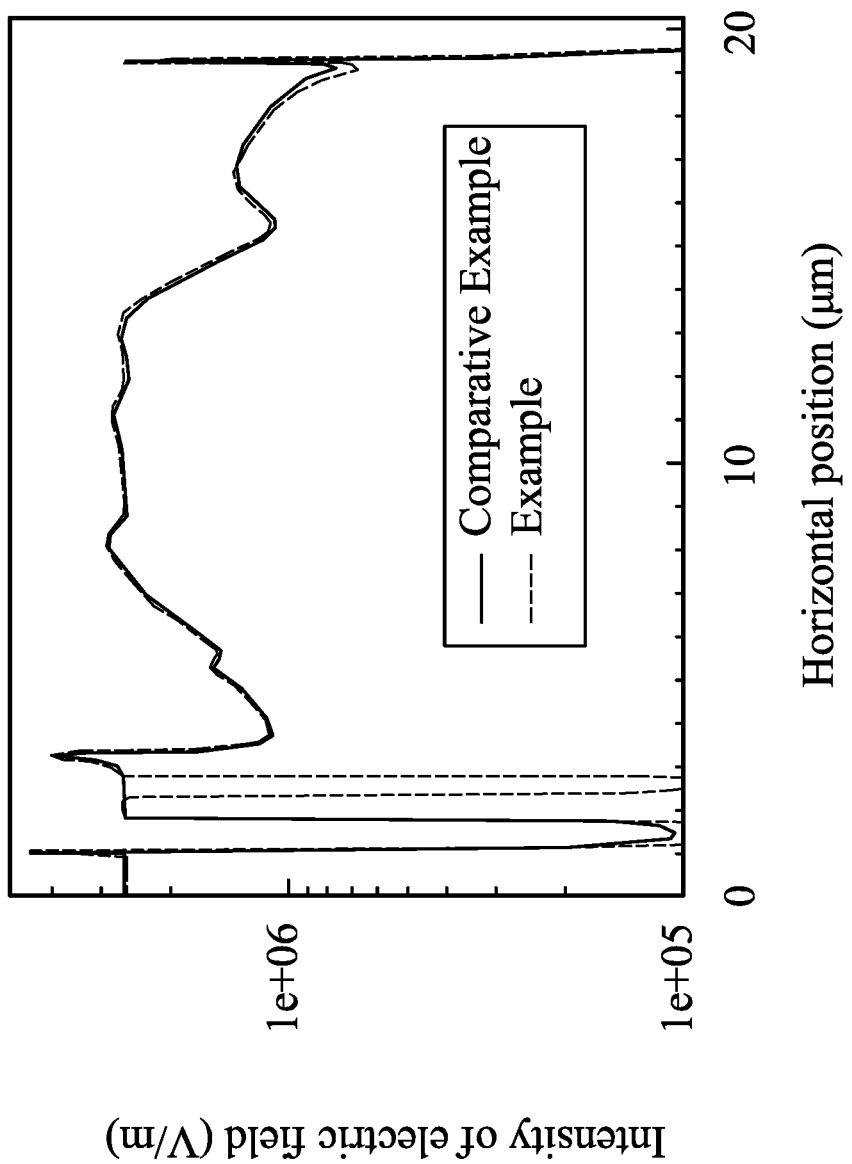
FIG. 12 illustrates intensities of electric fields near surfaces of semiconductor structures.

FIG. 12 illustrates a comparison between a comparative example and the example shown in FIG. 6. The Y-axis is the intensity of the electric field between the channel layer and the barrier layer near the surface of the semiconductor structure, and the X-axis is the corresponding position of the intensity of the electric field in the horizontal direction of the semiconductor structure. The origin of the X-axis is a position near the source in the semiconductor structure, and the corresponding position moves away from the position near the source toward the drain as the coordinate on the X-axis increases. The comparative example represents a doped compound semiconductor layer without any opening or notch, while the example in FIG. 6 effectively reduces the electric field near the surface by reducing the area of the doped compound semiconductor layer.

The embodiments of the present disclosure provides a doped compound semiconductor layer with one or more openings or notches, or a doped compound semiconductor layer with a discontinuous structure such that the area of the compound semiconductor layer in the semiconductor structure may be reduced. Therefore, the degradation of controllability of the gate electrode under the impact of environmental factors acting on the doped compound semiconductor layer during processes is obviated to improve the capability to drive current and electrical uniformity, and to further improve device performance. In addition, the semiconductor structure with a reduced area of the doped compound semiconductor layer may also reduce the electric field near the surface to achieve REduced Surface Field (RESURF). The above description is only one of the purposes of the present disclosure and it is not intended to limit the scope of present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a channel layer on the substrate;
a barrier layer on the channel layer;
a source structure and a drain structure on opposite sides of the barrier layer, and a first direction from the source structure to the drain structure;
a doped compound semiconductor layer on the barrier layer, wherein the doped compound semiconductor layer has a first side adjacent to the source structure, a second side adjacent to the drain structure, and the doped compound semiconductor layer has at least one opening exposing a portion of the barrier layer, wherein a material of the doped compound semiconductor layer comprises GaN;
a dielectric layer on the doped compound semiconductor layer and the barrier layer; and
a gate structure on the doped compound semiconductor layer and electrically connected to the doped compound semiconductor layer.

2. The semiconductor structure as claimed in claim 1, wherein a width of the at least one opening is between ⅓ and ⅔ of a distance between the first side and the second side of the doped compound semiconductor layer.

3. The semiconductor structure as claimed in claim 1, wherein the at least one opening comprises a plurality of openings, and a sum of widths of the openings is between ⅓ and ⅔ of a distance between the first side and the second side of the doped compound semiconductor layer.

4. The semiconductor structure as claimed in claim 1, further comprising a buffer layer between the substrate and the channel layer.

5. The semiconductor structure as claimed in claim 1, wherein the at least one opening comprises a plurality of openings, a minimum distance between adjacent ones of the openings in a second direction perpendicular to the first direction is ½ of the maximum width of the doped compound semiconductor layer in the first direction.

6. The semiconductor structure as claimed in claim 1, wherein a shape of the at least one opening comprises a rectangle, diamond, trapezoid, circle, oval, triangle, or a combination thereof.

7. The semiconductor structure as claimed in claim 1, wherein the at least one opening is disposed at one side of the doped compound semiconductor layer and the side of the doped compound semiconductor layer is parallel to the first direction.

8. The semiconductor structure as claimed in claim 7, wherein an extension direction of the at least one opening is perpendicular to the first direction.

9. The semiconductor structure as claimed in claim 7, wherein a shape of the doped compound semiconductor layer comprises an M-shape, U-shape, comb, or a combination thereof.

10. The semiconductor structure as claimed in claim 1, wherein the doped compound semiconductor layer comprises a plurality of discrete doped compound semiconductor islands.

11. The semiconductor structure as claimed in claim 10, wherein the doped compound semiconductor islands have a maximum sum of widths in the first direction, and the maximum sum is between ½ and 2 times a sum of the distances between adjacent doped compound semiconductor islands in the first direction.

12. The semiconductor structure as claimed in claim 11, wherein a shape of the discrete doped compound semiconductor islands comprises a rectangle, trapezoid, circle, oval, triangle, or a combination thereof.

* * * * *